United States Patent [19]

Neiss et al.

[11] Patent Number: 4,599,299
[45] Date of Patent: Jul. 8, 1986

[54] PROCESS FOR PREPARING OVERCOATED PHOTOHARDENABLE ELEMENT HAVING SURFACE PROTUBERANCES

[75] Inventors: Melvin A. Neiss, Annandale; Robert W. Woodruff, East Brunswick, both of N.J.

[73] Assignee: E. I. Du Pont de Nemours and Company, Wilmington, Del.

[21] Appl. No.: 748,662

[22] Filed: Jun. 25, 1985

Related U.S. Application Data

[60] Division of Ser. No. 610,843, May 16, 1984, Pat. No. 4,550,073, which is a continuation-in-part of Ser. No. 370,993, Apr. 22, 1982, abandoned.

[51] Int. Cl.$^4$ ................................................ G03C 1/76
[52] U.S. Cl. ...................................... 430/273; 430/271; 430/281; 430/312; 430/326; 430/394; 430/950; 430/961
[58] Field of Search ............... 430/271, 272, 273, 281, 430/287, 288, 950, 961, 326, 312, 394

[56] References Cited

U.S. PATENT DOCUMENTS

| 3,411,907 | 11/1968 | Whitmore et al. | 96/67 |
| 3,615,468 | 10/1971 | Tiala | 96/36.3 |
| 4,059,768 | 11/1977 | van Landeghem | 250/483 |
| 4,126,466 | 11/1978 | Roos | 96/84 |
| 4,157,918 | 6/1979 | Wanat et al. | 96/86 |
| 4,168,979 | 9/1979 | Okishi et al. | 96/75 |
| 4,229,517 | 10/1980 | Bratt et al. | 430/271 |
| 4,304,839 | 12/1981 | Cohen et al. | 430/253 |
| 4,311,784 | 1/1982 | Fan | 430/271 |
| 4,357,416 | 11/1982 | Fan | 430/302 |

FOREIGN PATENT DOCUMENTS 1512080  5/1978 United Kingdom .
2046461 11/1980 United Kingdom .

Primary Examiner—Jack P. Brammer

[57] ABSTRACT

A photohardenable element comprising a support bearing, in order, optionally a solvent-soluble nonphotosensitive layer, at least one photohardenable layer and a nonphotosensitive liquid removable layer, the photohardenable layer present immediately beneath the nonphotosensitive layer having therein substantially discrete, inert particles at least some of which cause protuberances in the nonphotosensitive layer. The particles have a size range of 0.1 to 10.0 μm, not more than 50% by volume being below 3.5 μm. A preferred element contains two photohardenable layers, the lower layer having an optical density greater than 3.0 over at least the 300 to 550 nm spectral region. The elements can be used for the preparation of proofs and printing plates.

9 Claims, No Drawings

PROCESS FOR PREPARING OVERCOATED PHOTOHARDENABLE ELEMENT HAVING SURFACE PROTUBERANCES

This is a divisional of application Ser. No. 610,843, filed May 16, 1984 now U.S. Pat. No. 4,550,073 which is a continuation-in-part of application Ser. No. 370,993, filed Apr. 22, 1982, now abandoned.

DESCRIPTION

1. Technical Field

This invention relates to an overcoated photohardenable element. More particularly this invention relates to an overcoated photohardenable element having protuberances in the overcoat layer. This invention also relates to processes for preparing and using the overcoated photohardenable element.

2. Background Art

Single layer and multilayer photohardenable elements are known. Such photohardenable elements are becoming increasingly useful for various printing and proofing uses as well as in the formation of photomasks. Some of these photohardenable elements work in the positive mode, i.e., they provide an exact duplicate of the original image. In order to prepare an exact duplicate image, however, the image-bearing film or transparency must be placed or brought into uniform optical contact with the rawstock photohardenable layer. Generally the photohardenable film and the image-bearing surface are placed in a vacuum frame and then imagewise exposed. In many instances due to poor drawdown the image-bearing film does not achieve uniform optical contact, and the image formed is distorted.

Photohardenable films having protective cover sheets or an outer overcoating are particularly useful for making exact duplicates of the image. The outer layer is relatively hard so that the image-bearing film does not adhere thereto. After imagewise exposure and development this protective outer layer is no longer present and the photohardenable layers of many of these elements still have some tackiness which makes them easily damaged when touched, susceptible to dirt pickup, and adherent to adjacent elements on storage.

An object of this invention is to provide photohardenable elements which in the rawstock state have good vacuum drawdown and in their processed state are substantially nontacky.

DISCLOSURE OF INVENTION

In accordance with this invention there is provided a photohardenable element comprising a support bearing, in order, optionally a solvent-soluble nonphotosensitive layer, at least one photohardenable layer and a nonphotosensitive liquid removable layer, the photohardenable layer present immediately beneath and in contact with the nonphotosensitive layer being nonpigmented unless it is the sole layer present between the support and nonphotosensitive liquid removable layer and having therein substantially discrete, inert particles at least some of which protrude into the nonphotosensitive layer to cause protuberances in the nonphotosensitive layer, the size of the particles being within the range of 0.1 to 10.0 μm, not more than 50% of the particles by volume being below 3.5 μm and having a specific gravity substantially equivalent to that of the surrounding photohardenable layer in which they are present.

In another embodiment of this invention there is provided a process for forming a photohardenable element comprising a support bearing, in order, optionally a solvent-soluble nonphotosensitive layer, at leat one photohardenable layer and a nonphotosensitive liquid removable layer, the photohardenble layer present immediately beneath and in contact with the nonphotosensitive layer being nonpigmented unless it is the sole layer present between the support and nonphotosensitive liquid removable layer and having present therein substantially, discrete inert particles at least some of which protrude into the nonphotosensitive layer to cause protuberances in the nonphotosensitive layer, said process comprising (1) coating onto a support a photohardenable or nonphotosensitive, solvent-soluble composition and drying the composition to form a layer no more than 15 μm in thickness and having an optical density of at least 3.0 over at least the 300 to 550 nm region of the spectrum; optionally (2) coating on dry layer (1) an emulsion formed from (a) a solution containing at least one ethylenically unsaturated monomeric compound and at least one photoinitiator and (b) a solution containing at least one polymeric binder, and drying layer (2), layer (1) or layer (2), if present, containing substantially discrete inert particles having sizes within the range of 0.1 to 10.0 μm, not more than 50% of the particles by volume being below 3.5 μm and having a specific gravity substantially equivalent to that of the photohardenable layer (1) or (2) and (3) overcoating the uppermost photohardenable layer with a liquid developable nonphotosensitive solution and drying said layer whereby at least some of the inert particles protrude into the nonphotosensitive layer causing protuberances therein.

The photohardenable elements of the invention are useful in many variations or configurations all of which have a support and an outer nonphotosensitive liquid removable overcoat layer. The term "photohardenable" means those materials containing ethylenically unsaturated or benzophenone-type groups in which an increase in molecular weight is caused by exposure to actinic radiation. Photohardenable materials include photopolymerizable as well as photocrosslinkable and photodimerizable compositions. The elements contain at least one pigmented or dyed layer. A single layer or multiphotohardenable layers can be present between the support and overcoat layers. The substantially discrete, inert particles or beads, which are described more fully below, are present in the photohardenable layer immediately below the outer nonphotosensitive layer, which in the element containing multiphotohardenable layers is a clear layer, i.e., transparent or translucent. The phrase "inert particles or beads" means that the particles or beads present in the photohardenable layer of the element do not affect the photographic properties thereof. In the photohardenable element containing a single photohardenable layer the particles must be present in the photohardenable layer which is pigmented. In still another element, a clear photohardenable layer containing the particles is present above a pigmented nonphotosensitive layer. In all element configurations the particles protrude into the overcoat layer causing protuberances in said layer. Generally the number of protuberances ranges from about $1 \times 10^6$ to $10 \times 10^6$ protuberances per square inch ($0.15 \times 10^6$ to $1.5 \times 10^6$ protuberances per square cm.) and more. The inert polymeric particles which protrude into the overcoat layer always have a portion of the overcoat layer over the particles, i.e., the particles remain within and are not above or external to the surface of the overcoat layer.

U.S. Pat. No. 4,162,162 describes a photopolymerizable element having two photopolymerizable layers, 6 to 15 μm total thickness, bottom layer pigmented, upper layer clear (as described in Example 7); U.S. Pat. No. 4,229,517 describes a single pigmented photopolymerizable layer, maximum thickness 8 μm, preferably 3 to 6 μm; and Fan U.S. Pat. No. 4,311,784 describes a nonphotosensitive solvent-soluble dye or pigment-containing layer having an optical density of at least 3.0 in the visible region of the spectrum and a maximum dry thickness of 15 μm as the bottom layer and an upper photosensitive layer having a maximum dry thickness of 8 μm preferably 3 to 6 μm. The disclosure of the elements of these patents are incorporated by reference.

A preferred element contains two photohardenable layers between the support and the outer nonphotosensitive layer, the lower layer being pigmented and having a thickness of no more than 6 μm and an optical density greater than 3.0 over at least the 300 to 550 nm region of the spectrum, and the upper clear photopolymerizable layer, 3 to 6 μm in thickness, containing the discrete particles.

The ingredients of the above-described elements are described in detail in the respective patents. The photohardenable layers contain (a) an ethylenically unsaturated compound capable of forming a high polymer by free radical initiated, chain propagating, addition polymerization or benzophenone type groups, 10 to 30% by weight, preferably 12 to 20% by weight; (b) an organic polymeric binder, 10 to 60% by weight, (c) a free radical generating addition polymerization initiator system activatable by actinic radiation, 0.1 to 20% by weight. Depending on the particular element used, (d) an actinic radiation absorbing material in an amount of 0 to 40% by weight can be present in a photohardenable or nonpolymerizable layer in such concentration to impart an optical density to the layer of at least 3.0 over at least the spectral range of 300 to 550 nm.

In the preferred element described above containing two photohardenable layers, the pigmented lower photohardenable layer contains a sensitizer in a sensitizing amount, e.g., as described in U.S. Pat. No. 4,162,162, column 2, lines 4 to column 3, line 34 and column 4, line 56 to column 6, line 65, which is incorporated by reference; a photoinhibitor compound of the type described in U.S. Pat. No. 4,198,242, column 7, line 31 to column 9, line 8, incorporated by reference. The photoinhibitor is ordinarily employed in concentrations of about 0.004 to about 0.7 part by weight per part of photopolymerizable composition, preferably about 0.10 to about 0.35 part by weight per part of photopolymerizable composition.

Useful unsaturated monomers (a) as described above are disclosed, for example, in U.S. Pat. No. 4,229,520, column 7, line 46 to column 8, line 3. Some additional unsaturated monomers include: di-(3-methacryloxy-2-hydroxypropyl)ether of bisphenol-A, di(2-methacryloxyethyl)ether of bisphenol-A, di-(3-acryloxy-2-hydroxypropyl)ether of bisphenol-A, di-(2-acryloxyethyl)ether of bisphenol-A, di-(3-methacryloxy-2-hydroxypropyl)ether of tetrachloro bisphenol-A, di(2-methacryloxyethyl)-ether of tetrachloro bisphenol-A, di-(3-methacryloxy-2-hydroxypropyl)ether of tetrabromo bisphenol-A, di-(2-methacryloxyethyl)ether of tetrabromo bisphenol-A, di-(3-methacryloxy-2-hydroxypropyl)ether of 1,4-butanediol, di-(3-methacryloxy-2-hydroxypropyl)ether of diphenolic acid. Useful polymeric binders (b) are disclosed in column 8, line 10 to column 9, line 27 of the same patent; useful photoinitiators (c) in column 5, line 38 to column 6, line 27 of the same patent; and useful actinic radiation absorbers (d) in column 6, line 31 to column 7, line 31 of the same patent. All of these disclosures being incorporated by reference.

As stated above, a single photohardenable layer containing a dye, pigment or an actinic radiation absorber; two photohardenable layers, the lower layer being pigmented and both layers absorbing actinic radiation; or a lower nonphotosensitive layer and upper photohardenable can be present on a suitable support, e.g., a rigid or flexible sheet, e.g., paper, plastic, etc. or metal. The major components of the photohardenable layer have been described above.

Suitable lower nonphotosensitive layers when used are thin, solvent-soluble, opaque organic polymeric or colloid layers (film forming materials which remain adhered to the support in the image areas of the exposed photohardenable layer. The nonphotosensitive layer typically contains a binder along with other minor constituents such as plasticizers, coating aids and in some instances tackifiers. The binder is preferably solid at 50° C. and is compatible with the incorporated colorant, if present. Examples of binders include: nonelastomeric binders both thermoplastic and nonthermoplastic, as disclosed in U.S. Pat. No. 3,060,023, e.g., cellulose ethers or esters; polyalkylene ethers; condensation polymers of glycols with dibasic acids; polymers and copolymers of vinyl esters; acrylic acids and esters; polyvinyl alcohol; cellulose; phenolic resins; and the like. Other binders, including a number of vinylidene polymers, are disclosed in U.S. Pat. Nos. 2,760,863 and 2,791,504. Still other useful binders are the N-methoxymethyl polyhexamethylene adipamide mixtures of British Pat. No. 826,272, the polyester, polyacetal or mixed polyesteracetal mixtures of U.S. Pat. No. 2,892,716; the fusible polyvinyl alcohol derivatives of U.S. Pat. No. 2,902,365; the fusible blends of selected organic-soluble, base-soluble cellulose derivatives of U.S. Pat. No. 2,902,365; the fusible blends of selected organic-soluble, base-soluble cellulose derivatives of U.S. Pat. No. 2,927,022; the polyvinyl acetals having extralinear vinylidene groups of U.S. Pat. No. 2,902,710; the linear polyamides containing extralinear N-acrylyloxymethyl groups of U.S. Pat. No. 2,972,540. The binders in these patents are incorporated by reference.

Elastomer rubber type polymers, both natural and synthetic, may be used, e.g., isobutylene, Thiokol A, nitrile rubbers, butyl rubber, chlorinated rubbers, polymers of butadiene, poly(vinylisobutylether), isoprene and random, teleblock and block copolymers, terpolymers or higher polymers, e.g., butadiene copolymerized with styrene, isoprene and neoprene, silicone elastomers, acrylic containing elastomers, etc. in various proportions.

Particularly preferred as binders are nonelastomeric, acidic, polymeric, organic compounds since the composition resulting is developable in solely aqueous alkaline solvent devoid of organic solvents. This is advantageous since organic solvents are costly, may be hazardous with respect to toxicity and/or flammability, may become scarce due to petrochemical shortages, and may pollute the air and water.

One class of film-forming binders which is soluble in aqueous alkaline media and is useful in the compositions of the present invention is vinyl addition polymers containing free carboxylic acid groups, which are prepared from 30 to 94 mole percent of one or more alkyl acrylates and 70 to 6 mole percent of one or more $\alpha$-$\beta$-ethylenically unsaturated carboxylic acids, and more preferably prepared from 61 to 94 mole percent of two alkyl acrylates and 39 to 6 mole percent of an $\alpha$-$\beta$-ethylenically unsaturated carboxylic acid. Suitable alkyl acrylates for use in preparing these polymeric binders include methyl acrylate, ethyl acrylate, propyl acrylate, butyl acrylate, methyl methcrylate, ethyl methacrylate, butyl methacrylate, etc. Suitable $\alpha$-$\beta$-ethylenically unsaturated carboxylic acids include acrylic acid, methacrylic acid and the like. Binders of this type, including their preparation, are described in German Application No. OS 2,320,849, published Nov. 8, 1973.

The advantages of using acidic binders can also be obtained by selecting a preformed, compatible macromolecular polymeric binding agent which is a copolymer of (1) a styrene-type of a vinyl monomer and (2) an unsaturated carboxy-containing monomer, as described in detail in British Pat. No. 1,361,298.

Suitable support materials to which the contiguous layer remains adhered include films composed of high polymers, which are cast as films from molten polymer, such as polyamides, e.g., polyhexamethylene sebacamide, polyhexamethylene adipamide; polyolefins, e.g., polypropylene; polyesters, e.g., polyethylene terephthalate, polyethylene terephthalate/isophthalate; vinyl polymers, e.g., vinyl acetals, vinylidene chloride/vinyl chloride copolymers, polystyrene, polyacrylonitrile; and cellulosics, e.g., cellulose acetate, cellulose acetate/butyrate, cellophane. A particularly preferred support material is polyethylene terephthalate film of the kind described in Alles et al., U.S. Pat. No. 2,627,088, and Alles, U.S. Pat. No. 2,779,684, with or without the surface coating described in the former patent. The support may have a resin "sub" or other layer thereon which may or may not be soluble and which for purposes of this invention is considered part of the support. However, the total thickness of the contiguous layer and any soluble sub or underlayer should not exceed 0.0006 inch (0.015 mm). By "soluble" is meant solubility in a solvent in which the contiguous layer is developable. Preferred soluble sub layers have a thickness not exceeding about 0.0002 inch (0.0005 mm). Where the particular application does not require that the base support be transparent, the contiguous composition may usefully be coated on an opaque support, such as paper, especially water-proof photographic paper; thin metal sheets, especially aluminum and copper sheets, cardboard, etc.

The nonphotosensitive layer present as the outer layer of the elements is a polymeric material, e.g., polyvinyl alcohol, gelatin, etc., coated in solution over the photohardenable stratum containing the discrete, inert particles or beads to leave, after removal of solvent, a dry overcoat layer, which depending on its composition, is at least partially soluble in or permeable to the solvent for the photohardenable layer. Some nonphotosensitive layers are described in U.S. Pat. No. 3,458,311 which is incorporated by reference.

Particles or beads are present in the photohardenable layer of the element immediately below the top nonphotosensitive layer and cause protuberances in the nonphotosensitive layer. The particles or beads are discrete, substantially nonagglomerating in the solvent used in the preparation of the photohardenable layer. The particles have sizes within the range of 0.1 to 10 $\mu$m, not more than 50% of the particles by volume being below 3.5 $\mu$m. If the particle size is too large undesirable pigmented spots may be seen in the processed film. Suitable particles which preferably are polymeric include: tetraethylene glycol dimethacrylate (TEDMA), trimethylolpropane triacrylate (50 to 25)/methylmethacrylate (50 to 75), trimethylolpropane triacrylate/styrene, trimethylolpropane triacrylate (25 to 10)/triethyleneglycol diacrylate (75 to 90), triethylene glycol dimethacrylate/methylmethacrylate, tetraethylene glycol dimethacrylate/methylmethacrylate, polyethylene etc. Preferred particles are discrete, substantially nonswellable, crosslinked polymeric beads which are nonagglomerating in solvent for the monomer or monomers used in the preparation thereof. Homopolymers of tri- and tetraacrylate and tri- and tetramethacrylate monomers, copolymers of said tri- and tetraacrylate and tri- and tetramethacrylate monomers, copolymers of one of said tri- and tetraacrylate or said tri- and tetramethacrylate monomers and up to 50% by weight of at least one monomer having one terminal ethylenic group, copolymers of one of said tri- and tetraacrylate or said tri- and tetramethacrylate monomers and up to 75% by weight of at least one monomer having two terminal ethylenic groups or three terminal ethylenic groups different from said tri- and tetraacrylate or tri- and tetramethacrylate monomers. These preferred crosslinked polymeric beads are described in Cohen and Lazaridis U.S.

application Ser. No. 370,992, now U.S. Pat. No. 4,414,278.

The particles or beads are generally present in the photohardenable layer in amounts of 1 to 50% by weight based on the weight of the layer, preferably 5 to 10% by weight. The amount present must not affect the photographic properties of the photohardenable layer.

A preferred embodiment is illustrated in Example 4 wherein the particles in the upper photohardenable layer, which extend into the nonphotosensitive overcoat layer and cause protuberances therein, are trimethylolpropane triacrylate polymer having a median particle size of about 4.0 μm by volume.

INDUSTRIAL APPLICABILITY

The photohardenable elements of this invention are useful in preparing films for exposing printing plates particularly in process color printing and for preparing color proofs from separation negatives. In printing plate applications, an important use is in a two exposure imaging system to yield a positive working photopolymer litho film. In such use a suitable element is (1) exposed imagewise to actinic radiation, e.g., below 400 nm, the element is (2) reexposed to actinic radiation above 400 nm, and the nonphotosensitive liquid removable layer and the unpolymerized areas of the photohardenable layers are (3) removed by liquid development. Inert particles remain present in the polymerized areas of the photohardenable layer. Negative working photopolymer litho films can also be prepared. The photohardenable elements in the rawstock state exhibit good vacuum drawdown. In their processed state the elements are substantially nontacky.

EXAMPLES

The following examples illustrate the invention wherein the parts and percentages are by weight. The polymeric molecular weights are expressed as number average molecular weights ($\overline{M}n$). The $\overline{M}n$ for the polymers described herein can be determined by gel permeation chromatography employing a polybutadiene standard or other standard known to those skilled in the art. In the examples tackiness (or nontackiness) is determined as follows: several sheets of exposed and developed film are stacked one above the other under a 1000 g weight and are maintained at 80% R.H. and 80° F. (26.7° C.) for 3 days. The films are then checked for tackiness. If a film sheet sticks to an adjacent sheet it is considered to be tacky.

EXAMPLE 1

A photopolymerizable composition, containing 32.5% solids, is prepared from the following ingredients:

| Ingredient | Weight (g) |
| --- | --- |
| Trimethylolpropane triacrylate | 84.1 |
| Tetraethylene glycol dimethacrylate | 84.1 |
| Copolymer of styrene/maleic anhydride (1.4/1) Mol. Wt., ca. 10,000 | 341.2 |
| Titanium acetyl acetonate, 75% in isopropanol | 24.1 |
| Ethyl tetrahydroquinoline chromanone | 5.6 |
| 1-(2'-Nitro-4',5'-dimethoxy)phenyl-1- | 50.3 |

| Ingredient | Weight (g) | |
| --- | --- | --- |
| (4-t-butylphenoxy)ethane | | |
| Bis(2-o-chlorophenyl-4,5-bis(3'-methoxyphenyl)imidazole | | 27.9 |
| Bis(2-o-chlorophenyl-4,5-bisphenyl)imidazole | | 27.9 |
| 1,4,4-Trimethyl-2,3-diazabicyclo[3.2.2]-non-2-ene-N,N'—dioxide | | 0.57 |
| Milled dispersion of | | 497.7 |
| (a) Sterling ® carbon black | 45 parts | |
| (b) 80% of terpolymer: ethyl acrylate (56.0), methyl methacrylate (37.0), acrylic acid (7.0) Acid No. 76–85; Mol wt. ca. 260,000, and 20% of a copolymer of styrene/maleic anhydride (1.4/1) Mol. Wt. ca. 10,000 | 54 parts | |
| (c) Stearic acid | 1 part | |
| Ethyl Cellosolve ® | | 188.5 |
| Methylene chloride | | 2167.7 |

This composition is thoroughly mixed, and is then machine coated on the resin subbed side of a 0.004 inch (0.01 cm) polyethylene terephthalate film support at 124 ft/min (37.8 m/min). The coating is dried at 170° F. (77° C.) to yield a black photopolymer layer with a coating weight of 50 mg/dm² (about 5.0 μm in thickness).

A second photopolymer composition is prepared by emulsifying the following Solutions A and B in a 2 stage Gaulin Homogenizer at 6000 psi (421.85 kg/sq cm).

Solution A is prepared by thoroughly mixing the following ingredients:

| Ingredient | Weight (g) |
| --- | --- |
| Tetraethylene glycol dimethacrylate | 43.0 |
| Trimethylolpropane triacrylate | 43.0 |
| Ethyl tetrahydroquinoline chromanone | 2.9 |
| 1-(2'-Nitro-4',5'-dimethoxy)phenyl-1-(4-t-butylphenoxy)ethane | 26.0 |
| Bis(2-o-chlorophenyl-4,5-bis(3'-methoxyphenyl)imidazole | 14.5 |
| Bis(2-o-chlorophenyl-4,5-bisphenyl)imidazole | 14.5 |
| 1,4,4-Trimethyl-2,3-diazabicyclo[3.2.2]-non-2-ene-N,N'—dioxide | 0.28 |
| Methylene chloride | 208.0 |

Solution B is prepared by thoroughly mixing the following ingredients:

| Ingredient | Weight (g) |
| --- | --- |
| Acrysol ® I-98 (acrylic copolymer supplied as a latex, Rohm & Haas Co., Philadelphia, PA) | 510.0 |
| Rhoplex ® B-505 (acrylic latex emulsion, Rohm & Haas Co., Philadelphia, PA) | 382.0 |
| 40% Dispersion of submicron poly (ethylene) particles in water | 286.0 |
| 10% Solution of octylphenoxy polyethoxy ethanol, dispersing agent | 86.0 |
| Ammonium hydroxide (28% solution) | 13.0 |
| Distilled water | 1888.0 |

The second photopolymer composition is stirred for 15 minutes. 44 Grams of trimethylolpropane triacrylate polymer beads having a particle median population diameter of 1.8 μm and 4.0 μm median volume diameter and specific gravity of about 1.3 are added to 3507 grams of the emulsion of Solutions A and B, and the photopolymer composition containing the beads is milled in a Kady Mill (Kinetic Dispersion Corp., Buffalo, NY) for 5 minutes, followed by 52 grams of a 5% solution of "FC-128", anionic fluorocarbon surfactant from 3M Co. The particle-containing photopolymer composition is stirred for an additional 30 minutes.

This composition is coated contiguous to the first photopolymerization layer at 30 ft/min. (914.4 cm/min). The resulting clear layer with a coating weight of ca. 40 mg/dm² (about 4.0 μm in thickness) is dried at 220° F. (104° C.).

An overcoat composition (~5.0% solids) is prepared as follows:

| Ingredient | Weight (g) |
| --- | --- |
| Distilled water | 2266.0 |
| Poly(vinyl alcohol) 13% solution | 1210.0 |
| Polyvinyl pyrrolidone(70)/vinyl acetate(30) copolymer | 17.3 |
| "FC-128" (Anionic fluorocarbon surfactant from 3M Co.) (5% solution) | 7.0 |

The composition is thoroughly mixed and is coated over the dry, clear photopolymerizable layer at 40 ft/min (12.19 m/min). The resulting layer is dried at 220° F. (104° C.). The layer thickness is about 1.3 μm.

The multilayered photopolymer element is placed in a vacuum frame and exhibits excellent drawdown within 30 seconds and is exposed for 20 seconds to a 4KW xenon arc light source manufactured by MacBeth Arc Light Co., Philadelphia, PA at a distance of 60 inches (152.4 cm) through a photographic positive image in contact with the overcoat layer. The positive image is then removed, and the element is reexposed for 60 seconds to the same light source through a cut-off filter which absorbs all the light below 400 nm. The film is then processed through an automatic processor described in U.S. Pat. No. 4,142,194, at 5 ft/min (152.4 cm/min) developed at 85° F. (29.4° C.) and rinsed at 100° F. (37.8° C.) to produce an exact duplicate of the original positive image. The surface of the processed element is determined to be nontacky by the tackiness test described above.

A control element is prepared by the procedure described above except that no polymer beads are added to the clear photopolymer layer. The control element takes 5 minutes to drawdown in the vacuum frame and the surface of the processed element is extremely tacky after storage under the conditions of the tackiness test described above.

EXAMPLE 2

Example 1 is repeated except that the following polymer beads are present in the upper photopolymer layer of their respective element.

Sample A:
Trimethylolpropane trimethacrylate (100), median diameter of 1.16 μm (population) and 2.0 μm (volume) (some aggregates, many fines);

Sample B:
Styrene(90)/trimethylolpropane trimethylacrylate (10), average diameter of 1.32 μm (population) and 2.73 μm (volume); and Sample C:
Methylmethacrylate(95)/tetraethylene glycol dimethacrylate(5), average diameter of 2.9 μm (population) and 5.5 μm (volume).

After exposing and developing the elements as described in Example 1 the following results with respect to drawdown in the vacuum frame and tackiness are achieved.

|  | Drawdown (sec) | Tack |
| --- | --- | --- |
| Sample A | 30 | nontacky |
| Sample B | greater than 30 | slight tack under conditions of tackiness test |
| Sample C | 30 | nontacky |

Sample B's slower drawdown time is due to the smaller size beads causing smaller protuberances in the overcoat.

EXAMPLE 3

Four photopolymer elements are prepared as described in Example 1 except that the clear photopolymer compositions are prepared by emulsifying below-listed Solutions A and B in the Gaulin Homogenizer, and after stirring the emulsion, 27.5 g of the following polymer beads are added:

Sample A:
Styrene(50)/trimethylolpropane triacrylate(50), average diameter of 1.33 μm (population) and 1.55 μm (volume) (some aggregates);

Sample B:
Methylmethacrylate(10)/trimethylolpropane triacrylate(90), median diameter of 1.38 μm (population) and 2.29 μm (volume) (some aggregates);

Sample C:
Methylmethacrylate(75)/tetraethylene glycol dimethacrylate(25), median diameter of 2.98 μm (population) and 5.14 μm (volume);

Sample D:
Trimethylolpropane triacrylate(100), median diameter of 1.55 μm (population) and 4.26 μm (volume).

The photopolymer solutions containing the polymer beads are milled in a Kady Mill (Kinetic Dispersion Corp., Buffalo, NY) for 5 minutes after which 33 g of a 5% solution of the anionic fluorocarbon surfactant described in Example 1 is added with additional stirring.

Solution A is prepared by thoroughly mixing the following ingredients:

| Ingredient | Weight (g) |
| --- | --- |
| Tetraethylene glycol dimethacrylate | 28.66 |
| Trimethylolpropane triacrylate | 28.66 |
| Ethyl tetrahydroquinoline chromanone | 1.93 |
| 1-(2'-Nitro-4',5'-dimethoxy)phenyl-1-(4-t-butylphenoxy)ethane | 17.30 |
| Bis(2-o-chlorophenyl-4,5-bis(3'-methoxyphenyl)imidazole | 9.66 |

-continued

| Ingredient | Weight (g) |
| --- | --- |
| Bis(2-o-chlorophenyl-4,5-bis-phenyl)imidazole | 9.66 |
| 1,4,4-Trimethyl-2,3-diazabicyclo[3.2.2]-non-2-ene-N,N'—dioxide | 0.187 |
| Methylene chloride | 138.66 |

Solution B is prepared by thoroughly mixing the following ingredients:

| Ingredient | Weight (g) |
| --- | --- |
| Acrysol ® I-98 (acrylic copolymer supplied as a latex, Rohm & Haas Co., Philadelphia, PA) | 340.0 |
| Rhoplex ® B-505 (acrylic latex emulsion, Rohm & Haas Co., Philadelphia, PA) | 254.66 |
| 40% Dispersion of submicron poly-(ethylene) particles in water | 190.66 |
| 10% Solution of octyl-phenoxy polyethoxy ethanol, dispersing agent | 57.33 |
| Ammonium hydroxide (28% solution) | 13.66 |
| Distilled water | 1258.66 |

After exposing and developing the elements as described in Example 1 the following results with respect to drawdown in the vacuum frame and tackiness are achieved.

|  | Drawdown (sec) | Tack |
| --- | --- | --- |
| Sample A | 30 | nontacky |
| Sample B | 30 | nontacky |
| Sample C | 30 | nontacky |
| Sample D | 30 | nontacky |

Sample D illustrates a preferred bead particle size. Some pigmented spots are present in Samples A and C caused by particle aggregates and too large beads, respectively.

EXAMPLE 4

The following photopolymerizable composition is prepared from the following ingredients:

| Ingredient | Weight (g) |
| --- | --- |
| Methylene chloride | 142,244.0 |
| Ethyl Cellosolve ® | 12,429.0 |
| Trimethylolpropane triacrylate | 5,047.0 |
| Tetraethylene glycol dimethacrylate | 5,047.0 |
| Copolymer of styrene/maleic anhydride (1.4/1) Mol. Wt., ca. 10,000 | 20,415.0 |
| Titanium acetyl acetonate, 75% in isopropanol | 1,227.0 |
| Ethyl tetrahydroquinoline chromanone | 333.64 |
| 1-(2'-Nitro-4',5'-dimethoxy)phenyl-1-(4-t-butylphenoxy)ethane | 3,017.6 |
| Bis(2-o-chlorophenyl-4,5-bis(3'-methoxyphenyl)imidazole | 1,676.0 |
| Bis(2-o-chlorophenyl-4,5-bis-phenyl)imidazole | 1,675.0 |
| 1,4,4-Trimethyl-2,3-diazabicyclo[3.2.2]-non-2-ene-N,N'—dioxide | 34.25 |
| Milled dispersion of | 29,951.0 |
| (a) Sterling ® carbon black | 45 parts |
| (b) 80% of terpolymer: ethyl acrylate (56.0), methyl methacrylate (37.0), acrylic acid (7.0) Acid No. | 54 parts |

-continued

| Ingredient | Weight (g) |
| --- | --- |
| 76–85; Mol wt. ca. 260,000, and 20% of a copolymer of styrene/maleic anhydride (1.4/1) Mol. Wt. ca. 10,000 | |
| (c) Stearic acid | 1 part |

This composition is thoroughly mixed, and is then machine coated on the resin subbed side of a 0.004 inch (0.01 cm) polyethylene terephthalate film support at 120 ft/min (36.58 m/min). The coating is dried at 170° F. (76.7° C.) to yield a black photopolymer layer with a coating weight of 50 mg/dm$^2$ (5 μm in thickness).

A second photopolymer composition is prepared by emulsifying the following Solutions A and B in a single stage Gaulin Homogenizer at 3000 psi (210.6 kg/sq cm). Solution A is prepared by thoroughly mixing the following ingredients:

| Ingredient | Weight (g) |
| --- | --- |
| Tetraethylene glycol dimethacrylate | 1872.0 |
| Trimethylolpropane triacrylate | 1874.0 |
| Ethyl tetrahydroquinoline chromanone | 125.0 |
| 1-(2'-Nitro-4',5'-dimethoxy)phenyl-1-(4-t-butylphenoxy)ethane | 1125.0 |
| Bis(2-o-chlorophenyl-4,5-bis(3'-methoxy-phenyl)imidazole | 624.0 |
| Bis(2-o-chlorophenyl-4,5-bis-phenyl)imidazole | 624.0 |
| 1,4,4-Trimethyl-2,3-diazabicyclo[3.2.2]-non-2-ene-N,N'—dioxide | 12.2 |
| Methylene chloride | 9072.0 |

Solution B is prepared by thoroughly mixing the following ingredients:

| Ingredient | Weight (g) |
| --- | --- |
| Acrysol ® I-98 (acrylic copolymer supplied as a latex, Rohm & Haas Co., Philadelphia, PA) | 22,228.0 |
| Rhoplex ® B-505 (acrylic latex emulsion, Rohm & Haas Co., Philadelphia, PA) | 16,648.0 |
| 40% Dispersion of submicron poly(ethylene) particles in water | 12,474.0 |
| 10% Solution of octyl-phenoxy polyethoxy ethanol, dispersing agent | 3,742.0 |
| Ammonium hydroxide | 450.0 |
| Distilled water | 82,330.0 |

The second photopolymer composition is stirred for 30 minutes, and 2,104 grams of 5% "FC-128", anionic fluorocarbon surfactant from 3M Co., are added. 1,905 Grams of trimethylolpropane triacrylate polymer beads having a particle median diameter of 1.8 μm (population) and 4.0 μm (volume) and specific gravity of about 1.3, 234 grams of "FC-128", and 16,955 grams of distilled water are mixed separately and the resulting solution is milled in a Greerco colloid mill, Greerco Corp., Hudson, N.H., for 10 minutes at 0.001 inch (0.025 mm) gap setting. The milled solution is then added to the emulsion described earlier. The polymer particle-containing photopolymer composition is stirred for more than 30 minutes.

The stirred composition is coated contiguous to the first photopolymerizable layer at 120 ft/min (36.58 m/min). The resulting layer with a coating weight of ca. 40 mg/dm² (about 4.0 μm in thickness) is dried at 225°–250° F. (107° to 121° C.).

An overcoat composition (~4.0% solids) is prepared as follows and is coated at 130 ft/min (39.62 m/min). The resulting layer is dried at 220° F. (104° C.). The layer thickness is about 1.3 μm.

| Ingredient | Weight (g) |
|---|---|
| Distilled water | 371,498.0 |
| Poly(vinyl alcohol) (13% solution) | 146,388.0 |
| Polyvinyl pyrrolidone(70)/vinyl acetate(30) copolymer (20% solution) | 10,485.0 |
| "FC-128" (Anionic fluorocarbon surfactant from 3M Co.) (5% solution) | 844.0 |

The element, after being exposed and processed as described in Example 1, is nontacky as determined by the tackiness test described above with few black specks. The element exhibits excellent drawdown within 30 seconds.

EXAMPLE 5

A photopolymerizable composition is prepared by thoroughly mixing Solutions A, B, and 824 g of Dispersion C in a Kady Mill for 30 minutes. 1250 Grams of water are then added to the mixture with gentle stirring to give a photopolymer composition containing 14% solids.

Solution A is prepared by gently mixing the following ingredients:

| Ingredient | Weight (g) |
|---|---|
| 10% Solution of an interpolymer formed from N—tert.-octyl acrylamide (40%), methylmethacrylate (34%), acrylic acid (16%), hydroxypropyl methacrylate (6%), and t-butylaminoethyl methacrylate (4%) Mol. Wt. ca. 50,000 | 2720.0 |
| 40% Dispersion of submicron poly(ethylene) particles in water (Misco Prod. Co.) | 105.0 |
| Lactic acid titanium chelate having the formula: | 23.0 |

$$NH_4^+{}^-OC\text{---}CHCH_3$$
$$\underset{O}{\|} \quad \underset{O}{|}$$
$$HO\diagdown\diagup$$
$$Ti$$
$$\diagup\diagup\diagdown OH$$
$$O \quad O$$
$$| \quad \|$$
$$H_3CH \quad CO^-NH_4^+$$

| | |
|---|---|
| 10% Solution of octylphenoxy polyethoxy ethanol, dispersing agent | 36.0 |

Solution B is prepared by thoroughly mixing the following ingredients:

| Ingredient | Weight (g) |
|---|---|
| Methylene chloride | 310.0 |
| Trimethylolpropane triacrylate | 170.0 |
| Michler's ketone | 8.6 |
| Ethyl Michler's ketone | 26.4 |
| Bis(2-o-chlorophenyl-4,5-bis(3'-methoxyphenyl)imidazole | 33.6 |
| Bis(2-o-chlorophenyl-4,5-bisphenyl)-imidazole | 33.6 |
| 2,2'-Dihydroxy-4-methoxy benzophenone | 14.6 |
| 2-(Silbyl-4″)-(naptho-1',2':4,5)-1,2,3-triazole-2″-sulfonic acid phenyl ester | 0.70 |
| 7-(4'-Chloro-6'-diethyl amino-1'3',5'-triazone-2'-yl) amino-3-phenyl coumarin | 14.6 |

Dispersion C is prepared by attritor milling the following ingredients followed by draining for 2 hours.

| Ingredient | Weight (g) |
|---|---|
| Interpolymer described in Solution A above | 45,000.0 |
| Permanent Yellow G.G. Pigment (C.I.#17) | 3690.0 |

1.5 Grams of trimethylolpropane triacrylate polymer beads having a particle median diameter of 1.4 μm (population) and 4.6 μm (volume) and specific gravity of about 1.3, are added to 150 g of the above-described photopolymer composition containing 14% solids, in a Waring Blendor and blended at 70 V for 5 minutes. To 78.0 g of the blended solution are added 1.2 grams of a 5% solution of the "FC-128" surfactant described in Example 1 followed by blending at 30 V for 5 minutes.

The resulting composition is then board coated on the resin subbed side of a 0.004 inch (0.01 cm) polyethylene terephthalate film support using a 0.002 inch (0.005 cm) doctor knife and dried using a heat gun to yield a yellow photopolymerizable layer having a coating weight of about 70 mg/dm² (7 μm in thickness). The dried yellow photopolymerizable element is overcoated as described in Example 1 and is designated Sample A.

A second sample (B) is prepared by overcoating another dried, yellow, photopolymerizable layer prepared as described above with the following overcoat:

| Ingredient | Weight (g) |
|---|---|
| Overcoat composition as in Example 1 | 100 |
| Distilled water | 100 |

After exposing for 30 seconds to a 4KW xenon arc light source manufactured by MacBeth Arc Light Co., Philadelphia, PA at a distance of 60 inches (152.4 cm) through a photographic image and processing and developing the above-described single photopolymer layer containing elements as described in Example 1 except that the film is processed through the processor at 15 ft/min (4.57 m/min), the following results are achieved:

| | Drawdown (sec) | Tack |
|---|---|---|
| Sample A | 30 | nontacky |
| Sample B | 30 | nontacky |

The protuberances in the overcoat layer are about 2 to 3 μm.

EXAMPLE 6

A photopolymer element is prepared as described in Example 1 except that the clear photopolymer composition is prepared by emulsifying 338 g and 3020 g of the below-listed Solutions A and B, in a Kady mill, and, after stirring, are added 51 grams of Eftofine ®Ft-800F, synthetic Fischer-Tropsch hydrocarbon wax particles manufactured by Dura Commodities Corporation, Harrison, NY, having a particle average size of about 2 μm and a maximum particle size of about 10 μm, specific gravity of 0.95 and melting point in the range of 113° to 118° C.

To the photopolymer solution containing the synthetic hydrocarbon wax particles are added 34 grams of a 5% solution of the anionic fluorocarbon surfactant described in Example 1 with stirring.

Solution A is prepared by thoroughly mixing the following ingredients:

| Ingredient | Weight (g) |
| --- | --- |
| Tetraethylene glycol dimethacrylate | 144.0 |
| Trimethylolpropane triacrylate | 145.0 |
| Ethyl tetrahydroquinoline chromanone | 9.6 |
| 1-(2'-Nitro-4',5'-dimethoxy)phenyl-1-(4-t-butylphenoxy)ethane | 86.8 |
| Bis(2-o-chlorophenyl-4,5-bis(3'-methoxyphenyl)imidazole | 48.1 |
| Bis(2-o-chlorophenyl-4,5-bis-phenyl)imidazole | 48.1 |
| 1,4,4-Trimethyl-2,3-diazabicyclo[3.2.2]-non-2-ene-N,N'—dioxide | 0.96 |
| Methylene chloride | 700.0 |

Solution B is prepared by thoroughly mixing the following ingredients:

| Ingredient | Weight (g) |
| --- | --- |
| Acrysol ® I-98 (acrylic copolymer supplied as a latex, Rohm & Haas Co., Philadelphia, PA) | 1715.0 |
| Rhoplex ® B-505 (acrylic latex emulsion, Rohm & Haas Co., Philadelphia, PA) | 1285.0 |
| 40% Dispersion of submicron poly(ethylene) particles in water | 963.0 |
| 10% Solution of octyl-phenoxy polyethoxy ethanol, dispersing agent | 289.0 |
| Distilled water | 6318.0 |

The element has a fast drawdown time of 15 seconds, and the processed element is nontacky after storage for 3 days under the conditions of the tackiness test described above.

We claim:

1. A process of forming a positive image comprising (1) exposing imagewise to actinic radiation a photohardenable element comprising a support bearing, in order, two photohardenable layers having a total thickness range of 6 to 15 μm said two photohardenable layers comprising (a) 10 to 30% by weight of an ethylenically unsaturated compound capable of forming a high polymer by free radical initiated, chain propagating, addition polymerization or benzophenone type groups, (b) 10 to 60% by weight of an organic polymeric binder, and (c) 0.1 to 20% by weight of a free radical generating addition polymerization initiator system activatable by actinic radiation; and an outer polymeric nonphotosensitive liquid removable layer which is at least partially soluble in or permeable to the solvent for the photohardenable layer, the photohardenable layer adjacent to the support being pigmented or dyed and having a thickness of no more than 8 μm and an optical density of at least 3.0 over at least the spectral range of 300 to 550 nm and the photohardenable layer present immediately beneath and in contact with the outer nonphotosensitive liquid removable layer being clear and having a thickness of no more than 7 μm and present therein 5% to 50% by weight based on the weight of said photohardenable layer of substantially discrete, inert polymeric particles at least some of which protrude into and remain within the outer nonphotosensitive layer to cause protuberances in the outer nonphotosensitive layer, the size of the particles being within the range of 0.1 to 10.0 μm, not more than 50% of the particles being below 3.5 μm and having a specific gravity substantially equivalent to that of the surrounding photohardenable layer in which they are present, (2) reexposing the element to actinic radiation above 400 nm, and (3) removing by liquid development the nonphotosensitive liquid removable layer and the unpolymerized areas of the photohardenable layers, discrete, inert particles being present in the polymerized areas of the clear photohardenable layer.

2. Process for forming a photohardenable element comprising a support bearing, in order, one photohardenable layer comprising (a) 10 to 30% by weight of an ethylenically unsaturated compound capable of forming a high polymer by free radical initiated, chain propagating, addition polymerization or benzophenone type groups, (b) 10 to 60% by weight of an organic polymeric binder, and (c) 0.1 to 20% by weight of a free radical generating addition polymerization initiator system activatable by actinic radiation; and an outer polymeric nonphotosensitive liquid removable layer which is at least partially soluble in or permeable to the solvent for the photohardenable layer, the photohardenable layer being pigmented or dyed and having therein 5% to 50% by weight based on the weight of said photohardenable layer of substantially discrete, inert polymeric particles, said process comprising (1) coating on the support an emulsion formed from
  (a) a solution containing at least one ethylenically unsaturated monomeric compound and at least one photoinitiator and (b) a solution containing at least one polymeric binder, and drying the photohardenable emulsion to form a layer having a maximum thickness of 8 μm, an optical density of at least 3.0 over at least the spectral range of 300 to 550 nm, and containing substantially discrete inert particles having sizes within the range of 0.1 to 10 μm, not more than 50% of the particles by volume being below 3.5 μm and having a specific gravity substantially equivalent to that of the surrounding photohardenable layer in which they are present; and (2) overcoating the dry photohardenable layer with the liquid developable nonphotosensitive solution and drying said solution to form a layer whereby at least some of the inert particles protrude into the nonphotosensitive layer causing protuberances therein.

3. A process according to claim 2 wherein the discrete, inert particles are polymeric particles taken from the group of trimethylolpropane triacrylate, methylmethacrylate/trimethylolpropane triacrylate, styrene/trimethylolpropane triacrylate, methylmethacrylate/triethylene glycol dimethacrylate, triethylene glycol diacrylate/trimethylolpropane triacrylate, and polyethylene.

4. Process for forming a photohardenable element comprising a support bearing, in order, two photohardenable layers having a total thickness range of 6 to 15 μm said two photohardenable layers comprising (a) 10 to 30% by weight of an ethylenically unsaturated compound capable of forming a high polymer by free radical initiated, chain propagating, addition polymerization or benzophenone type groups, (b) 10 to 60% by weight of an organic polymeric binder, and (c) 0.1 to 20% by weight of a free radical generating addition polymerization initiator system activatable by actinic radiation; and an outer polymeric nonphotosensitive liquid removable layer which is at least partially soluble in or permeable to the solvent for the photohardenable layer, the photohardenable layer adjacent to the support being pigmented or dyed and the photohardenable layer present immediately beneath and in contact with the outer nonphotosensitive liquid removable layer having therein 5% to 50% by weight based on the weight of said photohardenable layer of substantially discrete, inert polymeric particles, said process comprising
   (1) coating on the support an emulsion formed from (a) a solution containing at least one ethylenically unsaturated monomeric compound and at least one photoinitiator and (b) a solution containing at least one polymeric binder, and drying the photohardenable emulsion to form a layer having an optical density of at least 3.0 over at least the spectral range of 300 to 550 nm,
   (2) coating on said dry pigmented or dyed photohardenable layer an emulsion formed from (a) a solution containing at least one ethylenically unsaturated monomeric compound and at least one photoinitiator and (b) a solution containing at least one polymeric binder, and drying the photohardenable emulsion to form a layer containing substantially discrete inert particles having sizes within the range of 0.1 to 10 μm, not more than 50% of the particles by volume being below 3.5 μm and having a specific gravity substantially equivalent to that of the surrounding photohardenable layer in which they are present; and
   (3) overcoating the dry photohardenable layer with the liquid developable nonphotosensitive solution and drying said solution to form a layer whereby at least some of the inert particles protrude into the nonphotosensitive layer causing protuberances therein.

5. A process according to claim 4 wherein the layer coated in step (1) has a dry thickness of no more than 6 μm and the layer coated in step (2) has a dry thickness of 3 to 6 μm.

6. A process according to claim 4 wherein the discrete, inert particles are polymeric particles taken from the group of trimethylolpropane triacrylate, methylmethacrylate/trimethylolpropane triacrylate, styrene/trimethylolpropane triacrylate, methylmethacrylate/triethylene glycol dimethacrylate, triethylene glycol diacrylate/trimethylolpropane triacrylate, and polyethylene.

7. A process for forming a photohardenable element comprising a support bearing in order a solvent-soluble pigmented or dyed nonphotosensitive layer, a photohardenable layer comprising (a) 10 to 30% by weight of an ethylenically unsaturated compound capable of forming a high polymer by free radical initiated, chain propagating, addition polymerization or benzophenone type groups, (b) 10 to 60% by weight of an organic polymeric binder, and (c) 0.1 to 20% by weight of a free radical generating addition polymerization initiator system activatable by actinic radiation, and having therein 5% to 50% by weight based on the weight of said photohardenable layer of substantially discrete, inert polymeric particles; and an outer polymeric nonphotosensitive liquid removable layer which is at least partially soluble in or permeable to the solvent for the photohardenable layer, said process comprising
   (1) coating on the support the nonphotosensitive solvent-soluble composition and drying the composition to form a layer no more than 15 μm in thickness and having an optical density of at least 3.0 over at least the 300 to 550 nm region of the spectrum;
   (2) coating on said dry pigmented or dyed nonphotosensitive layer an emulsion formed from (a) a solution containing at least one ethylenically unsaturated monomeric compound and at least one photoinitiator and (b) a solution containing at least one polymeric binder and drying the photohardenable emulsion to form a clear layer no more than 8 μm in thickness containing substantially discrete inert particles having sizes within the range of 0.1 to 10 μm, not more than 50% of the particles by volume being below 3.5 μm and having a specific gravity substantially equivalent to that of the surrounding photohardenable layer in which they are present; and
   (3) overcoating the dry photohardenable layer with the liquid developable nonphotosensitive solution and drying said solution to form a layer whereby at least some of the inert particles protrude into the nonphotosensitive layer causing protuberances therein.

8. A process according to claim 7 wherein the layer coated in step (2) has a dry thickness of 3 to 6 μm.

9. A process according to claim 7 wherein the discrete, inert particles are polymeric particles taken from the group of trimethylolpropane triacrylate, methylmethacrylate/trimethylolpropane triacrylate, styrene/trimethylolpropane triacrylate, methylmethacrylate/triethylene glycol dimethacrylate, triethylene glycol diacrylate/trimethylolpropane triacrylate, and polyethylene.

* * * * *